United States Patent
Park et al.

(10) Patent No.: US 8,233,522 B2
(45) Date of Patent: Jul. 31, 2012

(54) DECISION FEEDBACK EQUALIZER FOR DIGITAL TV AND METHOD THEREOF

(75) Inventors: Sung-Ik Park, Daejon (KR); Hyoung-Nam Kim, Daejon (KR); Seung-Won Kim, Daejon (KR); Chieteuk Ahn, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1098 days.

(21) Appl. No.: 10/545,054

(22) PCT Filed: Feb. 11, 2004

(86) PCT No.: PCT/KR2004/000274
§ 371 (c)(1), (2), (4) Date: Aug. 10, 2005

(87) PCT Pub. No.: WO2004/086762
PCT Pub. Date: Oct. 7, 2004

(65) Prior Publication Data
US 2006/0098728 A1    May 11, 2006

(30) Foreign Application Priority Data
Feb. 11, 2003    (KR) .................. 10-2003-0008529

(51) Int. Cl.
*H03H 7/30* (2006.01)
*H03K 5/159* (2006.01)
(52) U.S. Cl. .................. 375/233; 375/234; 375/235
(58) Field of Classification Search ............ 375/233, 375/350, 230; 348/614, 21
See application file for complete search history.

(56) References Cited

U.S. PATENT DOCUMENTS

| | | | |
|---|---|---|---|
| 4,833,693 A | | 5/1989 | Eyuboglu |
| 5,432,821 A | * | 7/1995 | Polydoros et al. ............ 375/340 |
| 5,905,742 A | * | 5/1999 | Chennakeshu et al. ....... 714/792 |
| 6,178,209 B1 | | 1/2001 | Hulyalkar et al. |
| 6,426,972 B1 | | 7/2002 | Endres et al. |
| 6,850,563 B1 | * | 2/2005 | Hulyalkar et al. ............ 375/233 |
| 7,218,673 B2 | | 5/2007 | Chang et al. |
| 7,254,198 B1 | * | 8/2007 | Manickam et al. ........... 375/348 |
| 7,342,981 B2 | * | 3/2008 | Wongwirawat et al. ...... 375/326 |
| 2002/0154247 A1 | * | 10/2002 | Ghosh et al. .................. 348/614 |
| 2002/0154248 A1 | * | 10/2002 | Wittig et al. .................. 348/614 |

(Continued)

FOREIGN PATENT DOCUMENTS
KR    100210405    11/1998
(Continued)

OTHER PUBLICATIONS

Guozhu Long, et al; "The LMS Algorithm with Delayed Coefficient Adaptation" IEEE Transactions on Acoustics, Speech and Signal Processing, vol. 37, No. 9, pp. 1397-1405, Sep. 1999.

(Continued)

*Primary Examiner* — Kenneth Lam
*Assistant Examiner* — Qutbuddin Ghulamali
(74) *Attorney, Agent, or Firm* — Ladas & Parry LLP

(57) ABSTRACT

The conventional decision feedback equalizer has a drawback that can't decide symbols correctly because a simple slicer is used as a symbol detector. A decision feedback equalizer as a symbol detector uses a Trellis Coded Modulation (TCM) decoder whose Trace Back depth is 1 (TBD=1), to thereby decide symbols correctly without decoding delay.

4 Claims, 4 Drawing Sheets

U.S. PATENT DOCUMENTS

2002/0191689 A1  12/2002  Xia et al.
2003/0007554 A1* 1/2003  Birru .......................... 375/233
2003/0099289 A1* 5/2003  Birru .......................... 375/233

FOREIGN PATENT DOCUMENTS

KR       100311473        8/2000
KR    1020040025516 A    3/2004

OTHER PUBLICATIONS

M. Vedat Eyuboglu; "Detection of Coded Modulation Signals on Linear, Severely Distorted Channels Using Decision-Feedback Noise Prediction with Interleaving", IEEE Transactions on Communications, vol. 36, No. 4, pp. 401-409, Apr. 1988.

* cited by examiner

TRANSMISSION SIGNAL = ( 1.0, 1.0, 1.0, -3.0, -5.0 )
INPUT SIGNAL OF CONVENTIONAL SYMBOL DETECTOR = ( 1.7, -0.4, 2.5, -1.8, -5.2 )
OUTPUT SIGNAL OF CONVENTIONAL SYMBOL DETECTOR = ( 1.0, -1.0, 3.0, -1.0, -5.0 )
OUTPUT SIGNAL OF TCM DECODER = ( 1.0, 1.0, 1.0, -3.0, -5.0 )

DECISION FEEDBACK EQUALIZER FOR DIGITAL TV AND METHOD THEREOF

TECHNICAL FIELD

The present invention relates to an equalizer for digital broadcasting, in particular, an equalizer for terrestrial digital broadcasting using a Trellis-coded modulation (TCM) decoder whose Trace Back Depth (TBD) is 1 (TBD=1) as a symbol detector.

BACKGROUND OF THE INVENTION

In a general digital broadcasting system, because data are transmitted through limited frequency bandwidth, time dispersion effect can be occurred that pulse energy of a symbol is dispersed to a neighboring symbol pulse.

Also, in transmitted digital data, an Inter-symbol Interference (ISI) can be occurred due to multipath, frequency offset, and phase jitter, etc.

A repeater and a receiver of digital broadcasting use a channel equalizer, in particular, use a decision feedback equalizer updating a coefficient of a filter coefficient, in order to adaptively compensate channel effect.

FIG. 1 is a block diagram of a conventional decision feedback equalizer. As shown, the conventional decision feedback equalizer includes a Feed Forward Filter (FFF) 100 and a Feed Back Filter (FBF) 140 for removing Inter-symbol Interference (ISI), a symbol detector 120 for detecting a symbol from the filtered signal by comparing with a predetermined threshold, an error calculating unit 180 for calculating an error used for updating coefficients of filters, and a training sequence storing unit 160 for storing a predetermined training sequence of received data.

The training sequence is inserted into the digital broadcasting data according to predetermined interval and is used for reducing a decision error of an equalizer by estimating digital broadcasting channel characteristic.

Therefore, if the predetermined training sequence from the digital broadcasting transmitter is received, the conventional decision feedback equalizer opens an eye pattern which is a decision factor of performance and a reference for deciding an output signal, based on the training sequence stored at the training sequence storing unit 160.

The conventional decision feedback equalizer decides symbols from data having no training sequence if the eye pattern clearly opens. Because the FBF 140 removes the ISI occurred by a previously detected symbol, noise enhancement doesn't occurred, which often occurred in the linear equalizer.

However, because the conventional decision feedback equalizer uses a simple slicer as a symbol detector, it is much dependent on the eye pattern and if the eye pattern opens incorrectly, it is easy to detect symbols incorrectly.

If there is an error in symbol decision, the error is accumulatively spread over the whole equalizer through a feedback loop while passing the FBF 140. The error affects to the symbol decision and finally decreases the reliability of the decision feedback equalizer.

In the other side, there are many trials for reducing the decision error of the decision feedback equalizer in the data having no training sequence.

Representatively, a technology that uses a viterbi decoder having the decoding delay and allows the coefficient update of the equalizer to have the decoding delay, proposed in an article by G. Long, entitled "The LMS Algorithm with Delayed Coefficient Adaptation", *IEEE Trans. Acoust., Speech, Signal Processing,* vol. ASSP-37, on October, 1989.

Also, a technology that uses the viterbi decoder and solves the decoding delay by adding periodical interleaver and de-interleaver, proposed in an article by M. V. Eyuboglu, entitled "Detection of Coded Modulation Signals on Linear, Severely Distorted Channels Using Decision-Feedback Noise Prediction with Interleaving", *IEEE trans. Commun.,* vol. COM-36, p. 401-409, on April, 1988 and in U.S. Pat. No. 4,833,693.

However, because these technologies use the viterbi decoder whose delay value is (TBD-1) as a symbol detector, there are drawbacks that not only additional devices are required for removing the decoding delay but also 5 times memories than used in decoding are required in order to have sufficient performance of next parts of the equalizer.

Also, because American standard terrestrial digital broadcasting system uses twelve TCM encoders, a real decoding delay value of the decision feedback equalizer is 12× (TBD-1).

The decision feedback equalizer having a large decoding delay is not suitable for the digital broadcasting system requiring a quick decision of the received signals.

Therefore, the decision feedback equalizer that detects symbols correctly from data having no training sequence and has small decoding delay is strongly required.

BRIEF DESCRIPTION OF THE DRAWINGS

The above and other objects and features of the present invention will become apparent from the following description of the preferred embodiments given in conjunction with the accompanying drawings, in which.

DISCLOSURE OF INVENTION

Figure 1:
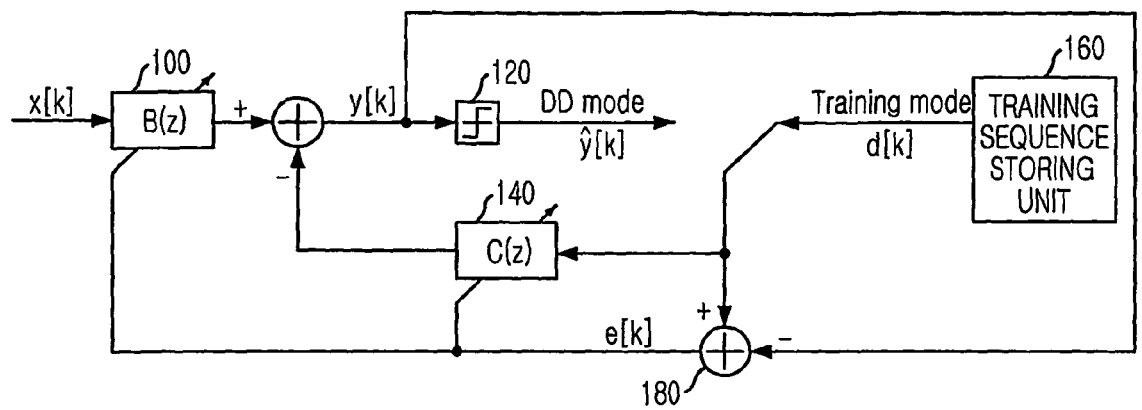
FIG. 1 is a block diagram of a conventional decision feedback equalizer.

It is, therefore, an object of the present invention to provide a decision feedback equalizer for deciding symbols without decoding delay, wherein the decision feedback equalizer uses a Trellis-coded modulation (TCM) decoder whose Trace Back Depth (TBD) is 1 (TBD=1) as a symbol detector of the decision feedback equalizer. It is another object of the present invention to reduce complexity of a TCM decoder by using an absolute distance as a decoding algorithm of the TCM decoder.

In accordance with one aspect of the present invention, there is provided a decision feedback equalizer for digital broadcasting, including: a filtering unit for removing Inter-symbol Interference (ISI) from received signals to generate a filtered signal; a symbol detecting unit for receiving the filtered signal from the filter and deciding a symbol of the filtered signal using a trellis decoding algorithm without decoding delay; and an error calculating unit for calculating an error signal based on the detected symbol of the symbol detecting unit in order to update the filter coefficients.

In accordance with one aspect of the present invention, there is provided a decision feedback equalizer for a digital TV wherein the decision feedback equalizer estimates a channel characteristic based on a predetermined training sequence and decides symbols of a transmission signal having no training sequence based on the estimated channel characteristic, including: a filtering unit for removing Inter-symbol Interference (ISI) from received signals to generate a filtered signal, wherein the filtering unit updates a coefficient based on the transmission signal and an error signal; a symbol detecting unit for deciding symbols of the filtered signal using a trellis decoding algorithm whose Trace Back Depth (TBD) is 1; and an error calculating unit for calculating the error signal based on the decided symbol and the filtered signal.

In accordance with one aspect of the present invention, there is provided a decision feedback equalizing method for digital broadcasting, including the steps of: a) removing Inter-symbol Interference (ISI) from received signals to generate a filtered signal; b) receiving the filtered signal and deciding a symbol based on the filtered signal using a trellis decoding algorithm without decoding delay; and c) calculating an error signal based on the decided symbol in order to update the filter coefficients.

In accordance with one aspect of the present invention, there is provided a decision feedback equalizing method of digital broadcasting, wherein the decision feedback equalizing method estimates a channel characteristic based on a predetermined training sequence and decides symbols of a transmission signal having no training sequence based on the estimated channel characteristic, including the steps of: a) updating a coefficient of a filtering means based on the transmission signal and an error signal and removing an interference of the transmission signal; b) deciding symbols of the filtered signal using a trellis decoding algorithm whose Trace Back Depth (TBD) is 1; and c) calculating the error signal based on the decided symbol and the filtered signal.

Those skilled in the art including the present invention can easily recognize other objects and benefits from detail description and claims of the present invention.

BEST MODE FOR CARRYING OUT THE INVENTION

The use of the conditional terms and embodiments presented in the present specification are intended only to make the concept of the present invention understood, and they are not limited to the embodiments and conditions mentioned in the specification.

In addition, all the detailed description on the principles, viewpoints and embodiments and particular embodiments of the present invention should be understood to include structural and functional equivalents to them. The equivalents include not only currently known equivalents but also those to be developed in future, that is, all devices invented to perform the same function, regardless of their structures.

Other objects and aspects of the invention will become apparent from the following description of the embodiments with reference to the accompanying drawings, which is set forth hereinafter.

Figure 2:
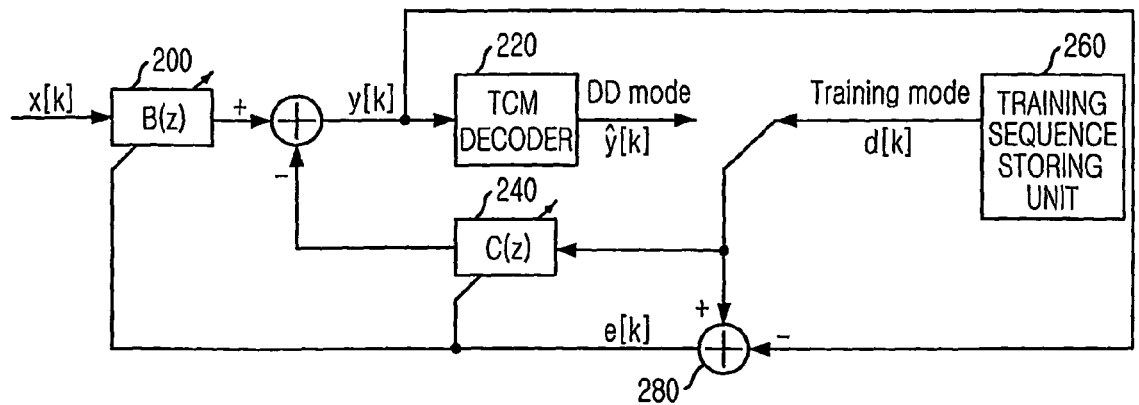
FIG. 2 is a block diagram of a decision feedback equalizer in accordance with the present invention.

FIG. 2 is a block diagram showing a decision feedback equalizer in accordance with the present invention. As shown, the decision feedback equalizer in accordance with the present invention includes a Feed Forward Filter (FFF) 200 and a Feed Back Filter (FBF) 240 for removing Intersymbol Interference (ISI) of a signal, a Trellis Coded Modulation (TCM) decoder 220 whose Trace Back Depth (TBD) is 1 (TBD=1) for detecting symbols of a filtered signal, an error calculating unit 280 for calculating an error signal, and a training sequence storing unit 260 for storing a predetermined training sequence of the received data.

A relation between an input signal x[k] of the filters and an output signal y[k] of the filters is expressed by Eq. (1).

$$y[k] = \sum_{i=0}^{N_b-1} b_i[k]x[k-i] - \sum_{j=1}^{N_a-1} a_j[k]\hat{y}[k-j] \qquad \text{Eq. (1)}$$

where $N_b$ is the number of coefficients of the FFF 200, $N_a$ is the number of coefficients of the FBF 240, $b_i[k]$ (i=0, ..., $N_b$-1) are the forward equalizer taps at time k and $a_j[k]$ (j=0, $N_a$-1) are the feedback taps at time k. $\hat{y}[k]$ is a signal of which symbol decided by the TCM decoder 220 in accordance with the present invention.

The error calculating unit 280 calculates the error signal according to Eq. (2) for updating coefficients of the filters.

$$e[k] = \hat{y}[k] - y[k] \qquad \text{Eq. (2)}$$

Based on the e[k] calculated by the error calculating unit 280, the FBF 200 updates the coefficients according to Eq. (3).

$$b_i[k+1] = b_i[k] + \mu e[k]x[k-i]$$

$$a_j[k+1] = a_j[k] - \mu e[k]\hat{y}[k-j] \qquad \text{Eq. (3)}$$

where µ is a step size and a value for deciding a convergence rate and a Mean Square Error (MSE) in steady state.

If the step size is large, the convergence rate of the equalizer is fast and the residual MSE in steady state is large. If the step size is small, the residual MSE in steady state is small and the convergence rate of the equalizer is fast.

Meanwhile, the Decision Feedback Equalizer in accordance with the present invention opens an eye pattern using the predetermined training sequence storing at the training storing unit 260 and then based on the eye pattern detects symbols when receiving non-training data signal.

Therefore, if there is a decision error, the error affects very much to the symbol decision because the error is accumulated in a feedback loop and spread out while passing the FBF 240.

Therefore, the present invention uses the TCM decoder whose TBD is 1 (TBD=1) as a symbol detector can detect correctly symbols during the reception of non-training data signal.

Also, when the eye pattern doesn't open due to sever environment caused by a long, the TCM decoder in accordance with the present invention can detect symbols correctly.

The present invention will be described with an example of American terrestrial digital TV standard, i.e., 8-vestigial sideband (VSB) system, hereinafter. In particular, the equalizer in accordance with the present invention can be used in a repeater and a receiver of the American terrestrial digital TV broadcasting system. However, it is apparent to ordinary one skilled in the art that spirit of the present invention is not limited to the American terrestrial digital TV broadcasting system.

The 8-VSB system uses one segment of the 313 segments as a training sequence, its transmission symbols are ±1, ±3, ±5, ±7 which are 1-dimensional symbols unlike the Quadrature Amplitude Modulation (QAM) of two-dimensional constellations.

Figure 3:
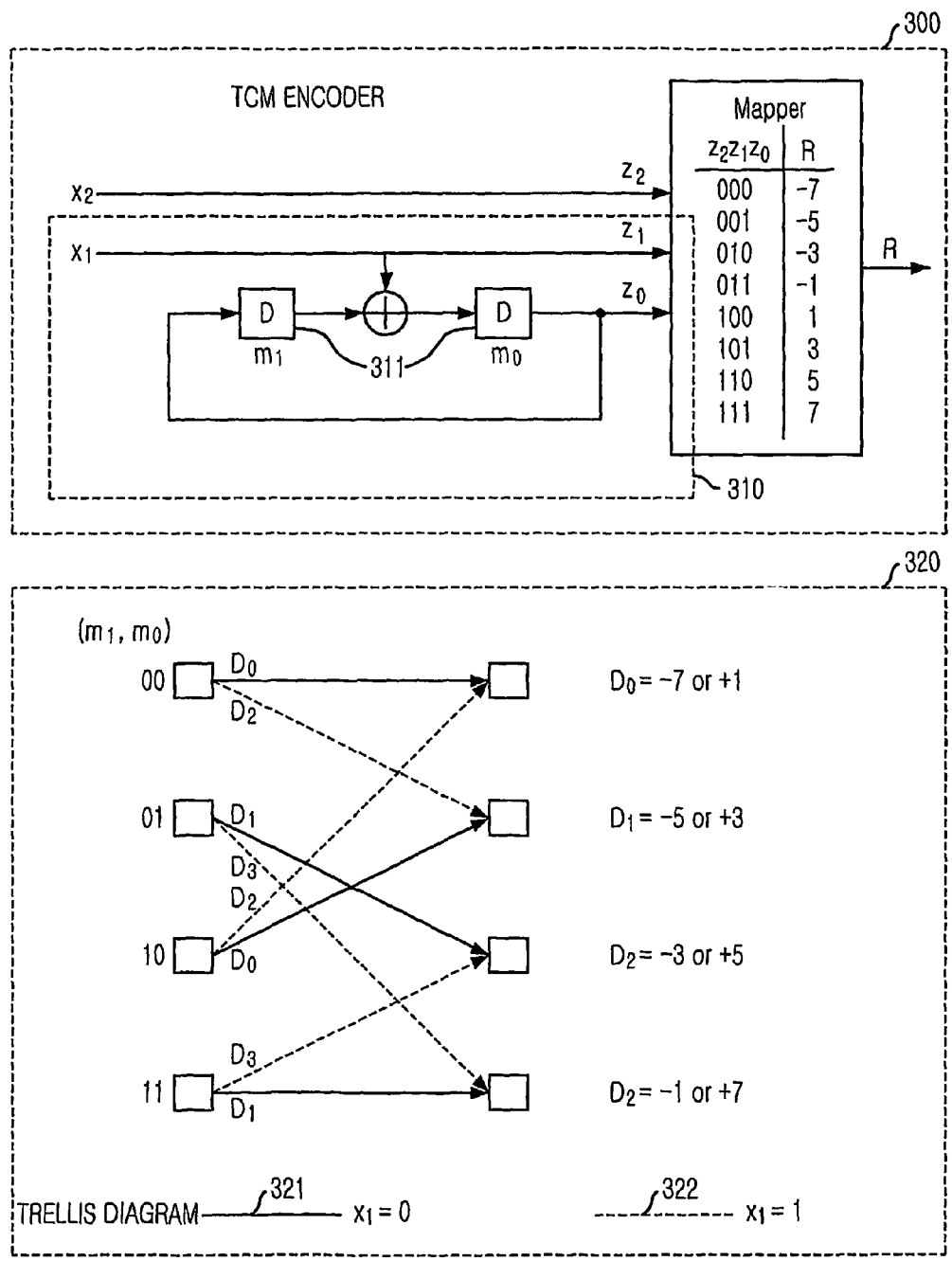
FIG. 3 is a block diagram and a trellis diagram of a Trellis Coded Modulation encoder in the 8-vestigial sideband (VSB) system which is the American terrestrial digital TV standard.

FIG. 3 is a block diagram and a trellis diagram of the TCM decoder in 8-VSB system which is the American terrestrial digital TV standard. The American terrestrial digital TV standard performs channel coding using twelve TCM encoders 300.

As shown, in the trellis diagram 320, a solid line 321 shows a state transition of a memory when input signal $x_1$ of a convolution encoder 310 is an 0 ($x_1$–0) and the dotted line 322 shows a state transition of the memory when the input signal $x_1$ of the convolution encoder 310 is 1 ($x_1$=1).

An encoded digital TV signal, which is encoded by the TCM encoder 300, is transmitted to a repeater and a receiver of the digital broadcasting system.

The received digital TV signal is decided, to thereby generate a correct symbol using to the decision feedback equalizer in accordance with the present invention.

Figure 4:
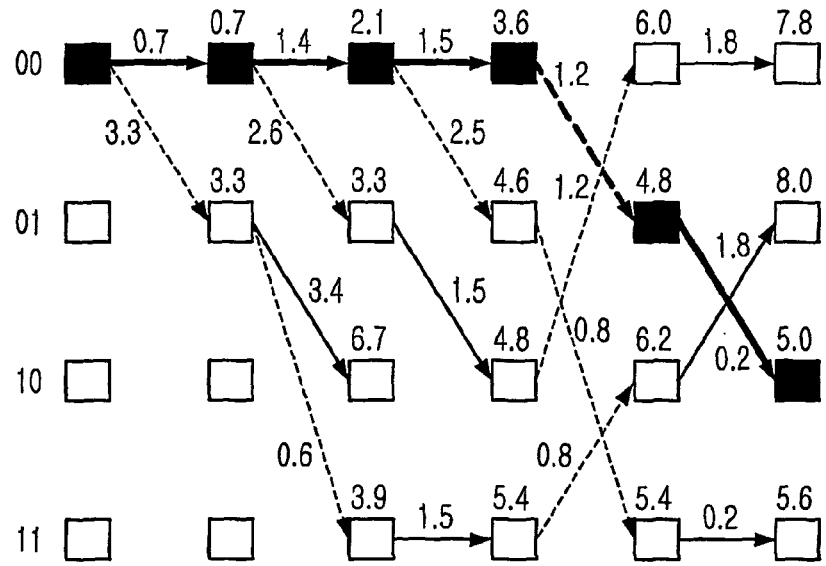
FIG. 4 is a diagram for describing operation of a TCM decoder in accordance with the present invention.

FIG. 4 is a diagram describing for the operation of the TCM decoder according to the present invention.

Assuming that the signal (1.0, 1.0, 1.0, –3.0, –5.0) is transmitted in an initial state wherein the memory is 0 ($m_1$=0, $m_0$=0) of the TCM encoder 311.

Also, assuming that the signal passing the FFF 200 and the FBF 240 and inputted into the symbol detector is (1.7, –0.4, 2.5, –1.8, –5.2).

Herein, because the conventional symbol detector is a simple slicer, it compares an input signal with a 8-VSB threshold and decides the closet threshold as a symbol. The output signal of the conventional slicer is (1.0, –1.0, 3.0, –1.0, 5.0).

Consequently, according to the conventional technology, it is apparent that three symbols are incorrectly decided by comparing the detected signal (1.0, –1.0, 3.0, –1.0, –5.0) with the transmission signal (1.0, 1.0, 1.0, –3.0, –5.0).

However, the decision feedback equalizer in accordance with the present invention can reduce the decision error of symbols dramatically without decoding delay because it uses the TCM decoder 220 whose TBD is 1 (TBD=1) as a symbol detector.

In particular, the TCM decoder 220 in accordance with the present invention detects symbols based on an accumulated absolute distance 410 among the 4 symbol pairs in the input signal y[k] and the trellis diagram 320. Since the process of calculating the absolute distance is simple compared with a square calculation of the general TCM decoding, it can reduce the complexity of the TCM decoder 220.

The absolute distance in accordance with the present invention is calculated according to Eq. 4.

$$\text{Absolute distance} = |y[k] - D_i|, \quad i=0,1,2,3 \qquad \text{Eq. (4)}$$

Thereafter, the TCM decoder selects the closest absolute distance 420 among the calculated absolute distance pairs 410 and calculates new accumulated absolute distance by adding the accumulated absolute distance calculated before with the absolute distance at each state appeared in the trellis diagram.

Thereafter, in time index k, selects a state having the smallest accumulated absolute value among the states appeared in the trellis diagram and gets the decided symbol from a node transited into the selected state of the trellis diagram.

The TCM decoder 220 operates the process at every time index k repeatedly, and referred to FIG. 4, the signal of which symbol is extracted by the TCM decoder 220 is (1.0, 1.0, 1.0, –3.0, –5.0).

Therefore, it is apparent that the signal (1.0, 1.0, 1.0, –3.0, –5.0) decided by the TCM decoder 220 in accordance with the present invention is equal to the transmission signal (1.0, 1.0, 1.0, –3.0, –5.0).

As mentioned above, the present invention uses the TCM decoder 220 whose TBD is 1 (TBD=1) as a symbol detector so that it can decide symbols correctly without the decoding delay, in particular, decreases the complexity of the TCM decoder by using the absolute distance in the process of the TCM decoding.

Figure 5:
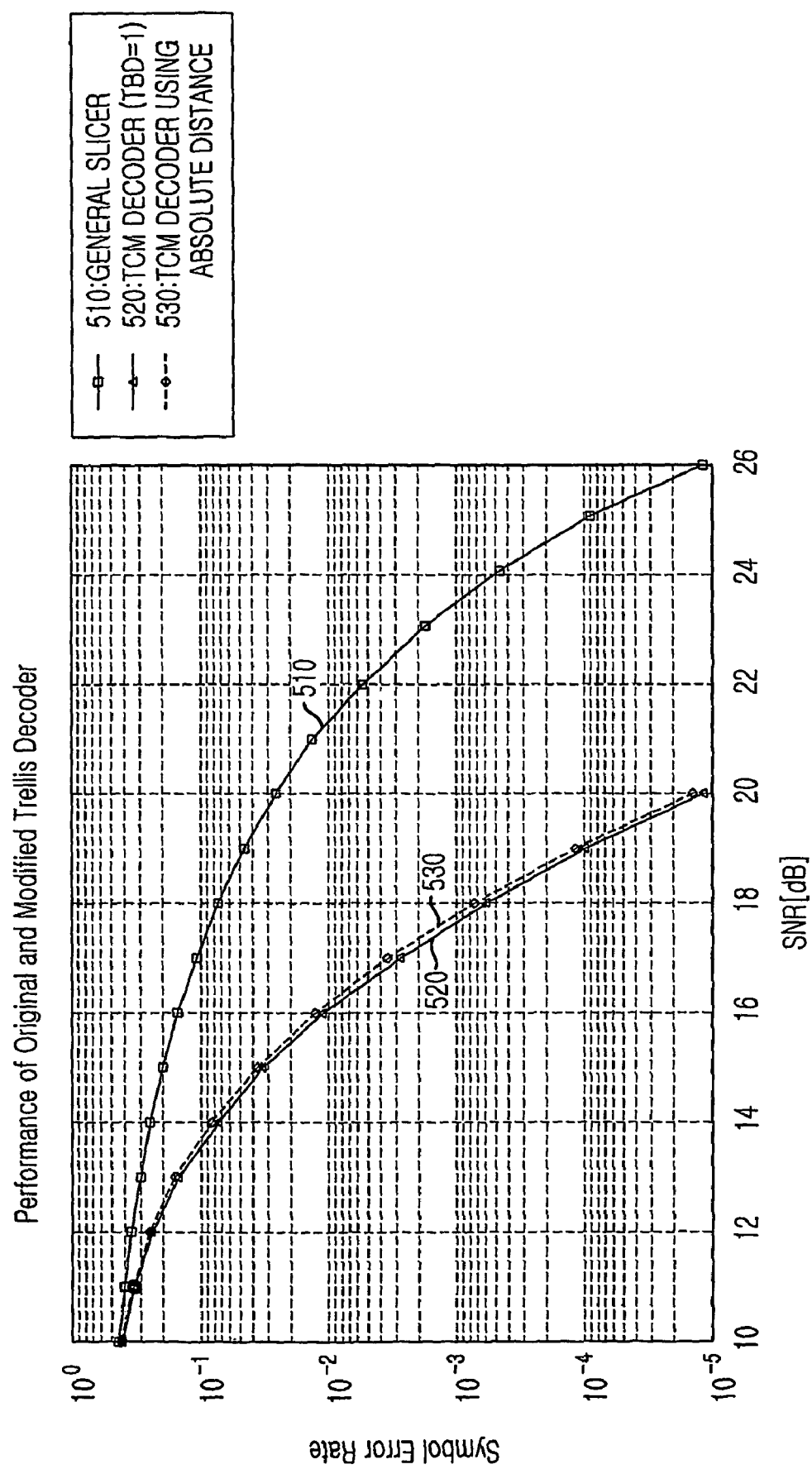
FIG. 5 is a graph showing the symbol error rate of a TCM decoder in accordance with the present invention and the conventional slicer.

FIG. 5 is a graph describing the comparison result between symbol decision errors of a TCM decoder 220 in accordance with the present invention and the conventional equalizer.

Symbols error rates 520, 530 of the TCM decoder 220 whose TBD is 1 (TBD=1) and the TCM decoder 220 decreasing the complexity by using the absolute distance in accordance with the present invention are remarkably smaller than the symbol error rate of the conventional slicer 510.

In accordance with the present invention, the decision feedback equalizer whose TBD is 1 (TBD=1) can decide symbols correctly without the decoding delay.

In addition, in the present invention, using the absolute distance as a decoding algorithm of the TCM decoder, it decreases the complexity of the TCM decoder 220.

Furthermore, by decreasing the symbol decision error of the symbol detector, it can increase the convergence rate of the decision feedback equalizer and decrease remarkably the MSE in steady state after convergence.

Therefore, the decision feedback equalizer can be used in the repeater and the receiver of the digital TV system.

While the present invention has been described with respect to certain preferred embodiments, it will be apparent to those skilled in the art that various changes and modifications may be made without departing from the scope of the invention as defined in the following claims.

What is claimed is:

1. A decision feedback equalizer for a digital broadcasting, comprising:
   a filtering means for removing Inter-symbol Interference (ISI) from received signals to generate a filtered signal;
   a symbol detecting means for receiving the filtered signal from the filter and deciding a symbol of the filtered signal using a trellis decoding algorithm wherein the symbol detecting means uses a Trellis Coded Modulation (TCM) decoder whose Trace Back Depth (TBD) is 1 (TBD=1),
   wherein the symbol detecting means is configured to calculate the distance among four symbol pairs $D_i$ for i=0, 1, 2, 3 of a 8-vestigial sideband (VSB) symbol pair, $D_0$=–7 or +1, $D_1$=–5 or +3, $D_2$=–3 or +5 and $D_3$=–1 or +7 and the filtered signal y[k],
   wherein the symbol detecting means is configured to select a closest distance from among the four symbol pairs and then the symbol detecting means calculates a new accumulated absolute distance by adding a previous accumulated distance calculated before with a next closest distance at each next state in the trellis decoding algorithm,
   wherein the symbol detecting means is further configured to select the next state having a smallest of the new accumulated distance among each of the next states in the trellis diagram and gets a next symbol from a node transited into for the selected next state of the trellis diagram, and
   wherein the received filtered signal of the symbol detecting means is output from the same symbol detecting means; and
   an error calculating means for calculating an error signal based on the decided symbol of the symbol detecting means in order to update the filter coefficients.

2. A decision feedback equalizer for a digital TV wherein the decision feedback equalizer estimates a channel characteristic based on a predetermined training sequence and detects symbols of a transmission signal having no training sequence based on the estimated channel characteristic, comprising:

a filtering means for removing Inter-symbol Interference (ISI) from received signals to generate a filtered signal, wherein the filtering means updates a coefficient based on the transmission signal and an error signal;

a symbol detecting means for deciding symbols of the filtered signal using a trellis decoding algorithm wherein the symbol detecting means uses a Trellis Coded Modulation (TCM) decoder whose Trace Back Depth (TBD) is 1, wherein the symbol detecting means is configured to calculate a distance among four symbol pairs $D_i$ for i=0, 1, 2, 3 of a 8-vestigial sideband (VSB) symbol pair, $D_0=-7$ or $+1$, $D_1=-5$ or $+3$, $D_2=-3$ or $+5$ and $D_3=-1$ or $+7$ and a filtered signal y[k], wherein the symbol detecting means is configured to select a closest distance from among the four symbol pairs and then the symbol detecting means calculates a new accumulated absolute distance by adding a previous accumulated distance calculated before with a next closest calculated distance at each next state in the trellis decoding algorithm, wherein the symbol detecting means is further configured to select the next state having a smallest of the new accumulated distance among each of the next states in the trellis diagram and gets a next symbol from a node transited into for the selected next state of the trellis decoding algorithm, and wherein the received filtered signal of the symbol detecting means is output from the same symbol detecting means; and an error calculating means for calculating the error signal based on the decided symbol and the filtered signal.

3. A decision feedback equalizing method for a digital broadcasting, comprising:

removing Inter-symbol Interference (ISI) from received signals to generate a filtered signal;

receiving the filtered signal and deciding a symbol based on the filtered signal using a trellis decoding algorithm using a Trellis Coded Modulation (TCM) decoder whose Trace Back Depth (TBD) is 1 (TBD=1), calculating an distance among four symbol pairs $D_i$ for i=0, 1, 2, 3 of a 8-vestigial sideband (VSB) symbol pair, $D_0=-7$ or $+1$, $D_1=-5$ or $+3$, $D_2=-3$ or $+5$ and $D_3=-1$ or $+7$ and a filtered signal y[k], selecting a closest distance from the four calculated distance pairs and then calculating a new accumulated distance by adding a previous accumulated distance calculated before with a next closest calculated distance at each next state in the trellis decoding algorithm, wherein the symbol detecting means is configured to select the next state having a smallest of the new accumulated distance among each of the next states in the trellis diagram and gets a next symbol from a node transited into for the selected next state of the trellis diagram, to output the received signals; and calculating an error signal based on the decided symbol in order to update the filter coefficients.

4. A decision feedback equalizing method of a digital broadcasting, wherein the decision feedback equalizing method estimates a channel characteristic based on a predetermined training sequence and decides symbols of a transmission signal having no training sequence based on the estimated channel characteristic, comprising:

updating a coefficient of a filtering means based on the transmission signal and an error signal and removing an interference of the transmission signal;

deciding symbols of the filtered signal using a trellis decoding algorithm whose Trace Back Depth (TBD) is 1 by calculating an distance among four symbol pairs $D_i$ for i =0, 1, 2, 3 of a 8-vestigial sideband (VSB) symbol pair, $D_0=-7$ or $+1$, $D_1=-5$ or $+3$, $D_2=-3$ or $+5$ and $D_3=-1$ or $+7$ and the filtered signal y[k], selecting a closest distance from the four calculated distance pairs and then calculating a new accumulated distance by adding a previous accumulated distance calculated before with a next closest calculated distance at each next state in the trellis decoding algorithm having a Trellis Coded Modulation (TCM) decoder whose Trace Back Depth (TBD) is 1 (TBD=1) in order to receive and output a signal, wherein a symbol detecting means is configured to select the next state having a smallest of the new accumulated distance among each of the next states in the trellis diagram and gets a next symbol from a node transited into for the selected next state of the trellis diagram; and calculating the error signal based on the decided symbol and the filtered signal.

* * * * *